(12) United States Patent
Ohmagari et al.

(10) Patent No.: US 11,355,591 B2
(45) Date of Patent: Jun. 7, 2022

(54) SINGLE CRYSTAL DIAMOND AND SEMICONDUCTOR ELEMENT USING SAME

(71) Applicant: National Institute of Advanced Industrial Science and Technology, Tokyo (JP)

(72) Inventors: Shinya Ohmagari, Ikeda (JP); Hideaki Yamada, Ikeda (JP); Akiyoshi Chayahara, Ikeda (JP); Yoshiaki Mokuno, Ikeda (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 25 days.

(21) Appl. No.: 16/956,499

(22) PCT Filed: Sep. 19, 2018

(86) PCT No.: PCT/JP2018/034651
§ 371 (c)(1),
(2) Date: Jun. 19, 2020

(87) PCT Pub. No.: WO2019/123745
PCT Pub. Date: Jun. 27, 2019

(65) Prior Publication Data
US 2021/0098578 A1   Apr. 1, 2021

(30) Foreign Application Priority Data

Dec. 20, 2017  (JP) .............................. JP2017-243965
Jun. 29, 2018  (JP) .............................. JP2018-124605

(51) Int. Cl.
C23C 16/27    (2006.01)
C30B 25/02    (2006.01)
(Continued)

(52) U.S. Cl.
CPC ........ *H01L 29/1602* (2013.01); *C23C 16/271* (2013.01); *C23C 16/274* (2013.01);
(Continued)

(58) Field of Classification Search
None
See application file for complete search history.

(56) References Cited

U.S. PATENT DOCUMENTS

2015/0176155 A1   6/2015  Ueda et al.
2015/0236097 A1*  8/2015  Suzuki ............... H01L 29/6603
                                                              257/77
(Continued)

FOREIGN PATENT DOCUMENTS

CN   104851920 A   8/2015
EP   2 276 068 A1  1/2011
(Continued)

OTHER PUBLICATIONS

Extended European Search Report issued for Counterpart European Patent Application. No. 18890500.4 dated Jun. 25, 2021.
(Continued)

*Primary Examiner* — Xiaoming Liu
(74) *Attorney, Agent, or Firm* — Knobbe, Martens, Olson & Bear, LLP

(57) ABSTRACT

Provided is a single crystal diamond having a lowered dislocation density. The single crystal diamond (10) is provided with single crystal diamond layers (2, 3). One single crystal diamond layer (2) is formed on a diamond substrate (1) and contains point defects. The other single crystal diamond layer (3) is grown on the single crystal diamond layer (2). The single crystal diamond layers (2, 3) have a lower dislocation density than the diamond substrate.

7 Claims, 12 Drawing Sheets

(51) Int. Cl.
    *C30B 29/04* (2006.01)
    *H01L 29/16* (2006.01)
    *H01L 21/02* (2006.01)
    *H01L 29/34* (2006.01)
    *H01L 29/66* (2006.01)
    *H01L 29/872* (2006.01)

(52) U.S. Cl.
    CPC .............. *C30B 25/02* (2013.01); *C30B 29/04* (2013.01); *H01L 21/0262* (2013.01); *H01L 21/02376* (2013.01); *H01L 21/02527* (2013.01); *H01L 29/34* (2013.01); *H01L 29/6603* (2013.01); *H01L 29/872* (2013.01)

(56) References Cited

U.S. PATENT DOCUMENTS

2016/0071936 A1* 3/2016 Eon .................. H01L 21/28537
                                                          438/570
2016/0340801 A1  11/2016 Ueda et al.

FOREIGN PATENT DOCUMENTS

| JP | 06-263594 A | 9/1994 |
| JP | 2012-176889 A | 9/2012 |
| JP | 2013-517631 A | 5/2013 |
| JP | 2016-213409 A | 12/2016 |
| WO | WO 2011/086164 A1 | 7/2011 |
| WO | WO 2014/003110 A1 | 1/2014 |

OTHER PUBLICATIONS

Chinese Office Action issued for Counterpart Chinese Patent Application No. 201880081889.7 dated Jun. 9, 2021.
Ohmagari, Shinya, et al., "Characterization of free-standing single-crystal diamond prepared by hot-filament chemical vapor deposition," Diamond & Related Materials 48(2014), pp. 19-23.
Ohmagari, S., et al., "Low resistivity $p^+$ diamond (100) films fabricated by hot-filament chemical vapor deposition," Diamond & Related Materials 58(2015), pp. 110-114.
Ohmagari, Shinya, et al., "Large reduction of threading dislocations in diamond by hot-filament chemical vapor deposition accompanying W incorporations," Applied Physics Letters 113 (2018) (in 4 pages).
Ohmagari, Shinya, et al., "Toward High-Performance Diamond Electronics: Control and Annihilation of Dislocation Propagation by Metal-Assisted Termination," Phys Status Solidi A, 216, (2019) (in 15 pages).
English Translation of International Search Report, PCT/JP2018/034651, dated Dec. 25, 2018.
Stehl, C. et al., (2013) "Efficiency of dislocation density reduction during heteroepitaxial growth of diamond for detector applications," Applied Physics Letters 103: 151905.
Ichikawa, K. et al., (2017) "Effect of stripe orientation on dislocation propagation in epitaxial lateral overgrowth diamond on Ir," Diamond & Related Materials 72: 114-118.
Naamoun, M., et al., (2015) "Reduction of dislocation densities in single crystal CVD diamond by using self-assembled metallic masks," Diamond & Related Materials 58: 62-68.

* cited by examiner (a)

(b)

(c)

(a)

(b)

(a)
10 μm

Substrate (b)
10 μm

SINGLE CRYSTAL DIAMOND AND SEMICONDUCTOR ELEMENT USING SAME

TECHNICAL FIELD

The present invention relates to a single crystal diamond and a semiconductor element using the same.

BACKGROUND ART

Conventionally, the methods described in Non-patent documents 1 to 3 are known as a method of lowering the dislocation density of a diamond film.

The method of lowering the dislocation density described in Non-patent document 1 is a method of lowering the dislocation density by increasing a diamond film thickness. It is described that the dislocation density can be lowered from $1 \times 10^{10}$ cm$^{-2}$ to $4 \times 10^{7}$ cm$^{-2}$ by increasing the thickness of a diamond film to 1 mm or more, but the effect becomes smaller as a distance between dislocation lines becomes larger as a result of the lowering the dislocation density, and hence the dislocation density cannot be lowered to a density below $1 \times 10^{6}$ cm$^{-2}$.

The method of lowering the dislocation density described in Non-patent document 2 is a method of lowering the dislocation density by forming a pattern, in which a nucleation region is limited, in a pretreatment for heteroepitaxial growth and by controlling a dislocation propagation direction with epitaxial lateral overgrowth (ELO). With this method, the dislocation density can be lowered to about $1 \times 10^{8}$ cm$^{-2}$.

The method of lowering the dislocation density described in Non-patent document 3 is a method of lowering the dislocation density by forming metal nanoparticles in an etch pit (location where a dislocation exists) and then by growing a diamond with CVD. Since the formation of the metal nanoparticles is required, it takes time and cost, and it is also a problem to control the dislocation propagation, and it has not been achieved to lower the dislocation below $1 \times 10^{6}$ cm$^{-2}$.

PRIOR ART DOCUMENTS

Non-Patent Documents

Non-patent Document 1: C. Stehl, M. Fischer, S. Gsell, E. Berdermann, M. S. Rahman, M. Traeger, O. Klein, and M. Scheck, "Efficiency of dislocation density reduction during heteroepitaxial growth of diamond for detector applications," APPLIED PHYSICS LETTERS 103, 151905 (2013).

Non-patent Document 2: Kimiyoshi Ichikawa, Hideyuki Kodama, Kazuhiro Suzuki, and Atsuhito Sawabe, "Effect of stripe orientation on dislocation propagation in epitaxial lateral overgrowth diamond on Ir," Diamond & Related Materials 72 (2017) 114-118.

Non-patent Document 3: M. Naamoun, A. Tallaire, P. Doppelt, A. Giccquel, J. Barjon, and J. Achard, "Reduction of dislocation densities in single crystal CVD diamond by using self-assembled metallic masks," Diamond & Related Materials 58 (2015) 62-68.

SUMMARY OF THE INVENTION

Problems to be Solved by the Invention

The methods described in Non-patent documents 1 to 3 are effective for a sample having a relatively high dislocation density, such as heteroepitaxial diamond, however, the lowering of the dislocation below $1 \times 10^{6}$ cm$^{-2}$ is consistently impossible, and the propagation of the dislocations cannot be completely suppressed.

Therefore, according to the embodiments of the present invention, a single crystal diamond having a lowered dislocation density is provided.

Further, according to the embodiments of the present invention, a semiconductor element using a single crystal diamond having a lowered dislocation density is provided.

Means for Solving the Problem (Configuration 1)

According to an embodiment of the present invention, a single crystal diamond includes a first single crystal diamond layer. The first single crystal diamond layer is formed on a substrate and contains point defects. The first single crystal diamond layer has a lower dislocation density than the substrate.

(Configuration 2)

In the configuration 1, the single crystal diamond further includes a second single crystal diamond layer. The second single crystal diamond layer is grown on the first single crystal diamond layer and has a lower dislocation density than the substrate.

(Configuration 3)

In the configuration 1 or 2, the first single crystal diamond layer contains: any one of tungsten, tantalum, rhenium, iron, nickel, cobalt, aluminum, gallium, germanium, iridium, and phosphorus; silicon; and molybdenum.

(Configuration 4)

In the configuration 2 or 3, the second single crystal diamond layer has a lower dislocation density than the substrate by two orders of magnitude or more.

(Configuration 5)

In any one of the configurations 1 to 4, the first single crystal diamond layer has a film thickness of 1 μm or more.

(Configuration 6)

In any one of the configurations 2 to 5, the second single crystal diamond layer has a film thickness of 200 μm or more.

(Configuration 7)

In any one of the configurations 2 to 5, the first single crystal diamond layer further contains a p-type dopant.

(Configuration 8)

Further, according to an embodiment of the present invention, a semiconductor element includes the single crystal diamond described in the configuration 7 and first and second metals. The first metal forms a Schottky contact with the second single crystal diamond layer. The second metal forms an ohmic contact with the first single crystal diamond layer or the second single crystal diamond layer.

Advantages of the Invention

The dislocation density of a single crystal diamond can be lowered.

EMBODIMENTS OF THE INVENTION

Figure 1:
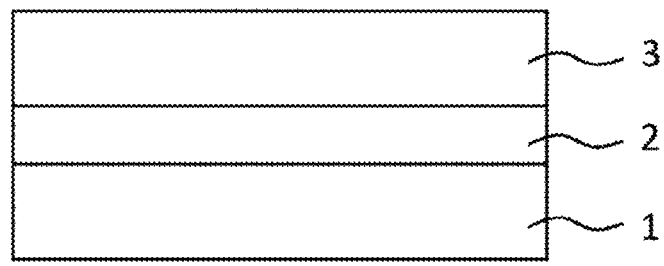
FIG. 1 is a sectional diagram of a single crystal diamond according to an embodiment of the present invention.

FIG. 1 is a sectional diagram of a single crystal diamond according to an embodiment of the present invention. With reference to FIG. 1, a single crystal diamond 10 according to the embodiment of the present invention includes a substrate 1 and single crystal diamond layers 2, 3.

The substrate 1 is made of single crystal diamond or heteroepitaxial diamond. The single crystal diamond has a dislocation density of, for example, $1\times10^2$ cm$^{-2}$ to $1\times10^6$ cm$^{-2}$, and the heteroepitaxial diamond has a dislocation density of, for example, $1\times10^8$ to $1\times10^{10}$ cm$^{-2}$ The substrate 1 may be made of a substrate in which an individual diamond plates are conjoined laterally (e.g., a grid pattern), so called mosaic wafer or mosaic substrate. Further, in the case of the heteroepitaxial diamond, the substrate may include materials other than diamond, such as iridium (Ir), silicon (Si), silicon carbide (SiC), gallium nitride (GaN), and tungsten carbide (WC), or the substrate may be made of free-standing crystal diamond excluding those heterogeneous substrates.

The single crystal diamond layer 2 is grown on the substrate 1 so as to contact the surface of the substrate 1. The single crystal diamond layer 2 contains: any one of tungsten (W), tantalum (Ta), rhenium (Re), iron (Fe), nickel (Ni), cobalt (Co), aluminum (Al), gallium (Ga), germanium (Ge), iridium (Ir), and phosphorus (P); silicon (Si); and molybdenum (Mo). Each of W, Ta, Re, Fe, Ni, Co, Al, Ga, Ge, Ir, and P is an element having a larger atomic radius than carbon (C) and entering between the lattices of a single crystal diamond.

The content of each of W, Ta, Re, Fe, Ni, Co, Al, Ga, Ge, Ir, and P is $1\times10^{16}$ cm$^{-3}$ to $1\times10^{20}$ cm$^{-3}$. The content of each of Si and Mo is lower than the content of any one of W, Ta, Re, Fe, Ni, Co, Al, Ga, Ge, Ir, and P by two orders of magnitude or more. In the single crystal diamond, the content of W, Ta, Re, Fe, Ni, Co, Al, Ga, Ge, Ir, and P is limited to $1\times10^{20}$ cm$^{-3}$, and it is not preferable to increase the content of W, Ta, Re, Fe, Ni, Co, Al, Ga, Ge, Ir, and P above $1\times10^{20}$ cm$^{-3}$. Any one of W, Ta, Re, Fe, Ni, Co, Al, Ga, Ge, Ir, and P, and Si and Mo produce point defects by being contained in the single crystal diamond layer 2. This point defect is formed between the lattices of the diamond. The point defect density of the single crystal diamond layer 2 is, for example, $1\times10^{16}$ cm$^{-3}$ to $1\times10^{20}$ cm$^{-3}$. The single crystal diamond layer 2 has a thickness of, for example, 1 to 2 μm. Here, the single crystal diamond layer 2 only needs to have a thickness of 1 μm or more. This is because if the thickness is 1 μm or more, the dislocation densities of the single crystal diamond layers 2, 3 can be made lower than the dislocation density of the substrate 1, as described later.

The single crystal diamond layer 2 may contain boron (B) or does not necessarily contain boron (B). If the single crystal diamond layer 2 contains B, the concentration of B is $1\times10^{18}$ cm$^{-3}$ to $1\times10^{21}$ cm$^{-3}$.

The single crystal diamond layer 3 is grown on the single crystal diamond layer 2 so as to contact the single crystal diamond layer 2.

The single crystal diamond layer 3 may or may not contain B. If the single crystal diamond layer 3 contains B, the concentration of B is $1\times10^{15}$ cm$^{-3}$ to $1\times10^{18}$ cm$^{-3}$. The thickness of the single crystal diamond layer 3 is not particularly limited, but when the single crystal diamond layer 3 is used for jewelry, the thickness of the single crystal diamond layer 3 should be 200 μm or more.

The single crystal diamond layer 2 has a dislocation density of $2\times10^6$ cm$^{-2}$ or less. The single crystal diamond layer 3 has a dislocation density of, for example, 0 to $1\times10^4$ cm$^{-2}$ (i.e., $1\times10^4$ cm$^{-2}$ or less). As described above, with the single crystal diamond layer 2 containing point defects (i.e., containing: any one of W, Ta, Re, Fe, Ni, Co, Al, Ga, Ge, Ir, and P; Si; and Mo), the dislocation density of the single crystal diamond layer 3 can be made lower than the substrate 1 by two orders of magnitude or more.

When the substrate 1 is made of single crystal diamond, the single crystal diamond layers 2, 3 are homoepitaxially grown, and when the substrate 1 is made of Si and the like other than single crystal diamond, the single crystal diamond layers 2, 3 are heteroepitaxially grown.

Figure 2:
FIG. 2 is step diagrams showing a manufacturing method of the single crystal diamond shown in FIG. 1.
Figure 2:
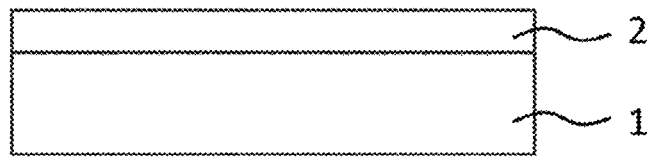
Figure 2:
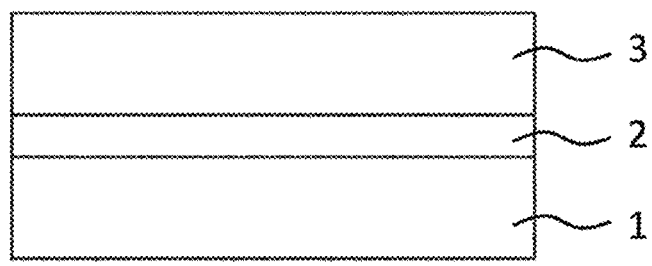

FIG. 2 is step diagrams showing a manufacturing method of the single crystal diamond 10 shown in FIG. 1. With reference to FIG. 2, the substrate 1 is firstly provided (see step (a)). The substrate 1 is, for example, a single crystal diamond having a (100) surface.

Next, the substrate 1 is placed in a vacuum chamber in which filaments are placed, and a carrier gas containing a carbon source is introduced into the vacuum chamber. Then, the single crystal diamond layer 2 is grown on the substrate 1 by a hot filament Chemical Vapor Deposition (CVD) method (see step (b)).

Subsequently, the single crystal diamond layer 3 is grown on the single crystal diamond layer 2 by a CVD method (see step (c)). Thereby, the single crystal diamond 10 is manufactured. As the CVD method, microwave plasma, DC plasma, a combustion method, an arc jet method, and a hot filament method can be used.

When the substrate 1 is made of Si and the like other than single crystal diamond, the single crystal diamond 10 is also manufactured according to the step diagrams shown in FIG. 2.

In the step (b), the single crystal diamond layer 2 may be formed by microwave plasma, DC plasma, a combustion method, an arc jet method, or the like using: any one of a gas containing a carbon source, a gas containing a tungsten source, a gas containing a tantalum source, and a gas containing a rhenium source; a gas containing a silicon source; and a gas containing a molybdenum source.

Figure 3:
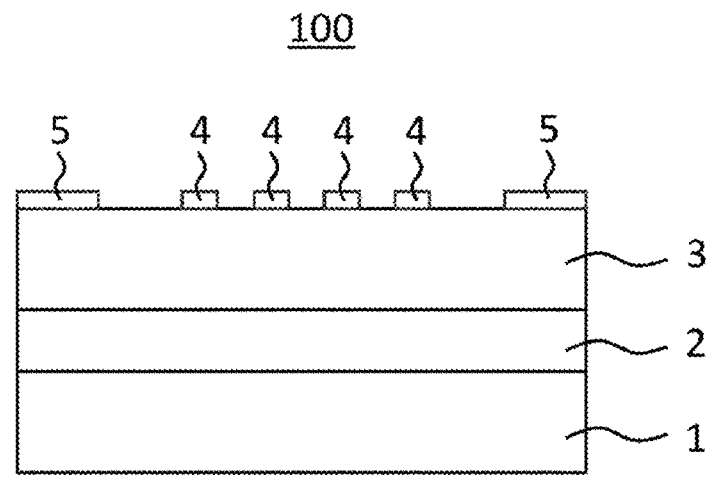
FIG. 3 is a sectional diagram of a semiconductor element according to an embodiment of the present invention.

FIG. 3 is a sectional diagram of a semiconductor element according to an embodiment of the present invention. With reference to FIG. 3, a semiconductor element 100 according to the embodiment of the present invention includes the substrate 1, the single crystal diamond layers 2, 3, and electrodes 4, 5. That is, the semiconductor element 100 has a configuration in which the electrodes 4, 5 are added to the single crystal diamond 10 shown in FIG. 1.

The electrodes 4, 5 are disposed on the single crystal diamond layer 3 so as to contact the single crystal diamond layer 3. The electrode 4 is an electrode for Schottky contact, and the electrode 5 is an electrode for ohmic contact.

The electrode 4 is made of, for example, any one of Mo/Au, Ru/Au, Au, Ru, Pt, and Mo, and the electrode 5 is made of, for example, any of Ti/Mo/Au, Ti/Pt/Au, and Ti/Au.

In the semiconductor element 100, the single crystal diamond layer 2 is made of p-type B-doped single crystal diamond film. The concentration of B is, for example, $1 \times 10^{20}$ cm$^{-3}$. The single crystal diamond layer 3 may or may not be doped with B. When B is doped, the concentration of B is $1 \times 10^{15}$ cm$^{-3}$ to $1 \times 10^{18}$ cm$^{-3}$.

The semiconductor element 100 is manufactured by, after the single crystal diamond 10 is manufactured according to the step diagrams shown in FIG. 2, forming the electrodes 4, 5 on the single crystal diamond layer 3 with, for example, a chemical vapor deposition method.

Figure 4:
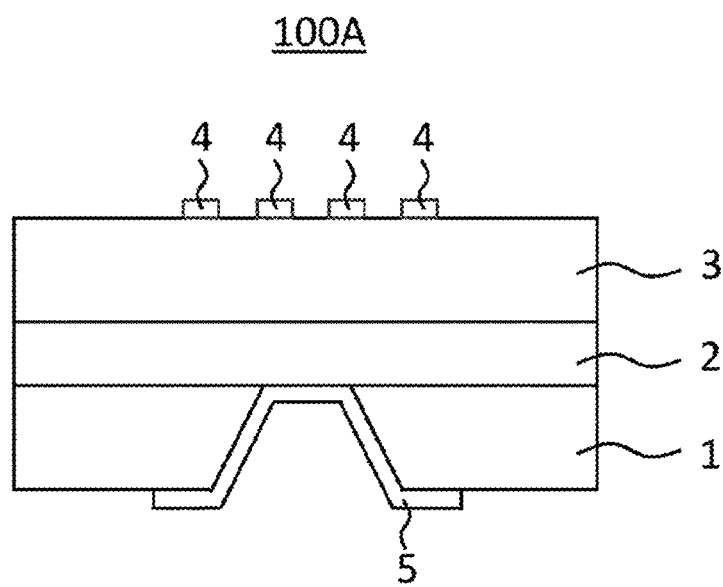
FIG. 4 is a sectional diagram of another semiconductor element according to the embodiment of the present invention.

FIG. 4 is a sectional diagram of another semiconductor element according to the embodiment of the present invention. The semiconductor element according to the embodiment of the present invention may be a semiconductor element 100A shown in FIG. 4.

With reference to FIG. 4, the semiconductor element 100A has a structure in which part of the substrate 1 is removed by etching and the electrode 5 is formed so as to contact the substrate 1 and the single crystal diamond layer 2. In the semiconductor element 100A, carriers (holes and electrons) move vertically between the electrodes 4, 5, so that a series resistance can be reduced.

The semiconductor element 100A is manufactured by: after the single crystal diamond 10 is manufactured according to the step diagrams shown in FIG. 2, removing part of the substrate 1 by etching; forming the electrodes 4 on the single crystal diamond layer 3 by, for example, a chemical vapor deposition method; and forming the electrode 5 so as to contact the substrate 1 and the single crystal diamond layer 2.

As described above, the single crystal diamond 10 according to the embodiment of the present invention has a structure in which: the single crystal diamond layer 2 having point defects is formed on the substrate 1; and the single crystal diamond layer 3 is formed on the single crystal diamond layer 2.

In the growth of a single crystal diamond, when the substrate 1 has dislocations, the single crystal diamond formed on the substrate 1 grows by inheriting the dislocations of the substrate 1. When the single crystal diamond layer 2 is formed on the substrate 1, however, the point defects in the single crystal diamond layer 2 suppress the propagation (propagation in the thickness direction) of the dislocations which extended from the substrate 1.

As a result, the single crystal diamond layer 2 has a lower dislocation density than the substrate 1. When the single crystal diamond layer 3 is then formed on the single crystal diamond layer 2, the single crystal diamond layer 3 only inherits the dislocations in the single crystal diamond layer 2. As a result, the dislocation densities of the single crystal diamond layers 2, 3 can be made lower than the substrate 1. Therefore, when the single crystal diamond 10 has the structure of substrate 1/single crystal diamond layer 2/single crystal diamond layer 3, the dislocation density of the substrate 1 can be suppressed from propagating to the single crystal diamond layers 2, 3.

The single crystal diamond according to the embodiment of the present invention may be one obtained by removing the single crystal diamond layer 3 from the single crystal diamond 10 shown in FIG. 1. The reason is as follows: the single crystal diamond has the structure of substrate 1/single crystal diamond layer 2, and the dislocations that have propagated from the substrate 1 are suppressed in the middle of the single crystal diamond layer 2 (in the middle in the thickness direction of the single crystal diamond layer 2) from further propagating in the thickness direction of the single crystal diamond layer 2 by the point defects; and hence when the single crystal diamond according to the embodiment of the present invention has the structure of substrate 1/single crystal diamond layer 2, a single crystal diamond having a lower dislocation density than the substrate 1 can be formed.

Hereinafter, the single crystal diamond according to the embodiment of the present invention and a semiconductor element using the same will be described in detail by using examples.

Example 1

A CVD substrate was used as the substrate 1. The off-angle of the (100) surface of the CVD substrate was set to 3.

A hot filament CVD apparatus (Model-650, made by sp3 Diamond Technologies, Inc.) was used for growing the single crystal diamond layer 2. This hot filament CVD apparatus has 19 filaments placed in parallel. The filament material is made from tungsten (W) with a purity of 99.9%, and has a diameter of 0.12 mm and a length of 40 cm. The distance between filaments and the substrate 1 was 15 mm.

The CVD substrate was placed on a sample stage in the hot filament CVD apparatus, and the hot filament CVD chamber was evacuated down to the pressure of 1 Pa.

Then, DC power of 180V×60 A was applied to the hot filaments to raise the temperature of the hot filaments to 2100° C.

Then, 30 sccm of methane (CH$_4$) gas and 1000 sccm of hydrogen (H$_2$) gas were introduced into the hot filament CVD apparatus, the pressure was set to 3990 Pa, and the temperature of the substrate was 700° C. to 800° C. Thereafter, a single crystal diamond was grown for ten hours, so that the single crystal diamond layer 2 having a thickness of 2 μm was formed on the substrate 1.

After the single crystal diamond layer 2 was formed, the substrate 1/single crystal diamond layer 2 was taken out of the hot filament CVD apparatus, and the substrate 1/single crystal diamond layer 2 was introduced on a sample stage in a 5 kW microwave plasma CVD apparatus made by SEKI DIAMOND SYSTEMS.

Then, the inside of the microwave plasma CVD chamber was evacuated down to the pressure of $5\times10^{-5}$ Pa.

Subsequently, 20 sccm of methane ($CH_4$) gas and 480 sccm of hydrogen ($H_2$) gas were introduced into the microwave plasma CVD apparatus, the pressure was set to 15960 Pa, and the temperature of the substrate was set to 900° C.

Then, a single crystal diamond was grown on the single crystal diamond layer 2 for one hour by applying a high-frequency power of 2500 W and by a microwave plasma CVD, so that the single crystal diamond layer 3 having a thickness of 4 μm was formed on the single crystal diamond layer 2.

The cathodoluminescence of a single crystal diamond 10-1 in Example 1 was measured. The apparatus used for the measurement is JSM-7001F made by JEOL Ltd. The measurement conditions of cathodoluminescence is acceleration voltage 15 kV, sample temperature 300K, and the center wavelength of a bandpass filter of 430 nm.

Figure 5:
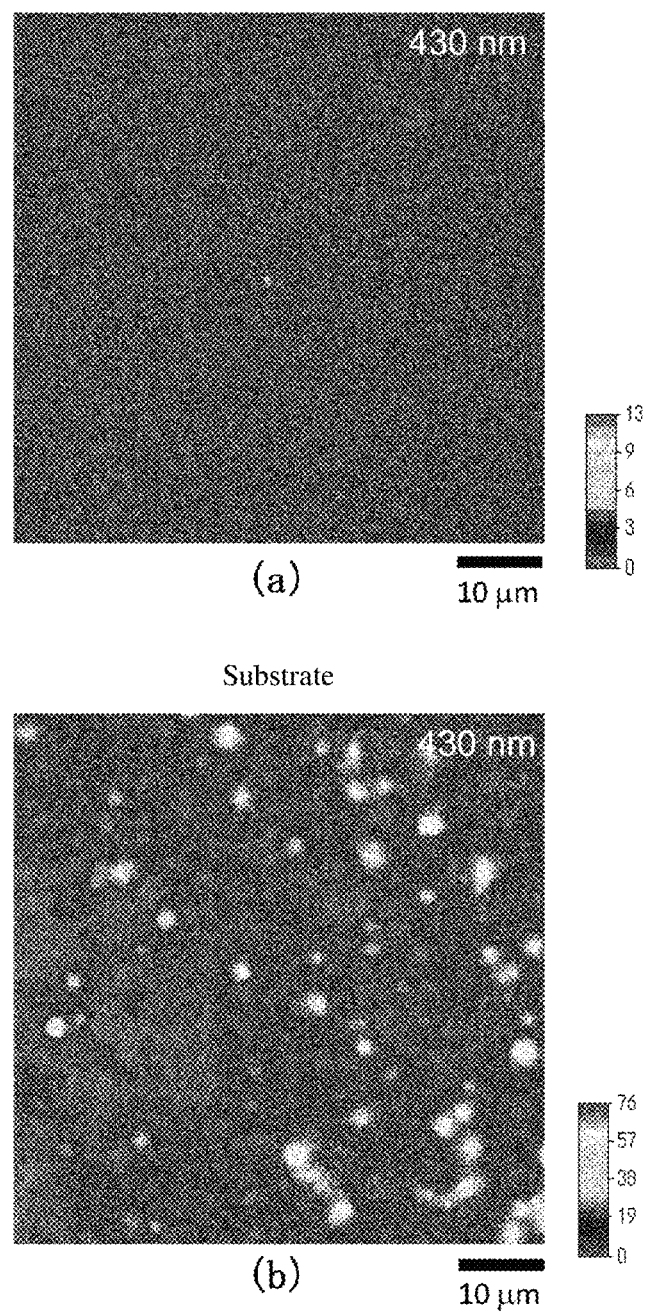
FIG. 5 is diagrams showing results of measuring the cathodoluminescence of a single crystal diamond in Example 1.

FIG. 5 is diagrams showing results of the cathodoluminescence of the single crystal diamond 10-1 in Example 1. FIG. 5(a) shows a result of the cathodoluminescence of the single crystal diamond 10-1 in Example 1, and FIG. 5(b) shows a result of the cathodoluminescence of the diamond substrate (substrate 1).

With reference to FIG. 5, almost no light emission was observed from the single crystal diamond 10-1 in Example 1 (see (a) of FIG. 5). On the other hand, a lot of light emission was observed from the diamond substrate.

Then, from the cathodoluminescence measurements, the dislocation density of the single crystal diamond 10-1 in Example 1 was estimated to be $2.6\times10^4$ $cm^{-2}$, and the dislocation density of the diamond substrate was estimated to be $2.1\times10^6$ $cm^{-2}$.

As described above, the dislocation density can be lowered by about two orders of magnitude by adopting the configuration of single crystal diamond layer 2/single crystal diamond layer 3. In the diamond field, researchers are not aware that a dislocation density can be lowered. Therefore, the effect that the dislocation density can be lowered as shown in Example 1 is an effect that cannot be expected by those skilled in the art. Further, the effect that the dislocation density can be lowered from $2.1\times10^6$ $cm^{-2}$ to $2.6\times10$ $cm^{-2}$ by two orders of magnitude is an effect that cannot be expected at all by those skilled in the art. As described above, by adopting the configuration of single crystal diamond layer 2/single crystal diamond layer 3, it is possible to enjoy remarkable effects that cannot be expected by those skilled in the art.

Secondary-ion Mass Spectrometry (SIMS) was measured in order to examine the tungsten concentration of the single crystal diamond layer 2. The apparatus used for the SIMS measurement is CAMECA IMS-7f.

Figure 6:
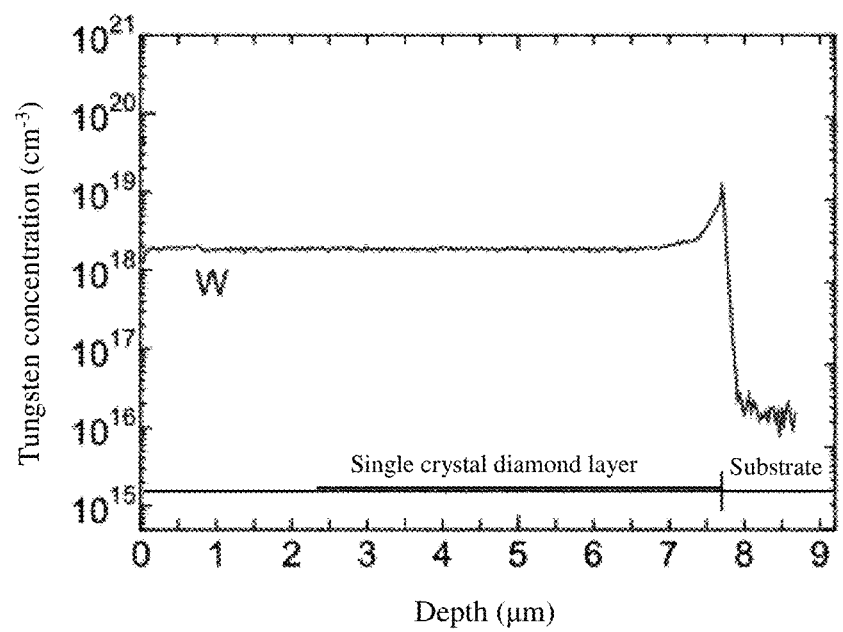
FIG. 6 is a graph showing a distribution of tungsten in the depth direction.

FIG. 6 is a graph showing a distribution of tungsten in the depth direction. In FIG. 6, the vertical axis represents a tungsten concentration, and the horizontal axis represents a distance from the surface in the depth direction. The thickness of the single crystal diamond layer 2 used for the SIMS measurement is 7.5 m.

With reference to FIG. 6, it was found that tungsten was uniformly distributed in the depth direction at a concentration of about $2\times10^{18}$ $cm^{-3}$. It was found that when a single crystal diamond was grown by a hot filament CVD method using hot filaments made of tungsten, as described above, tungsten was incorporated into the single crystal diamond. It was also found from the results of the SIMS measurement that the diamond grown by the hot filament CVD method contained $1.4\times10^{16}$ $cm^{-3}$ of Mo and $1.0\times10^{16}$ $cm^{-3}$ of Si. As described above, the contents of Si and Mo are lower than that of W by two orders of magnitude or more.

According to the results of the above-described cathodoluminescence and SIMS measurements, it was found that by the single crystal diamond layer 2 containing: any one of tungsten, tantalum, rhenium, iron, nickel, cobalt, aluminum, gallium, germanium, iridium, and phosphorus: molybdenum; and silicon, the dislocation density can be lowered to $2.6\times10^4$ $cm^{-2}$. It is because if it is shown that the dislocation density of the single crystal diamond 10-1 can be lowered by the single crystal diamond layer 2 containing tungsten, molybdenum, and silicon, it can be easily understood that the dislocation density of the single crystal diamond 10-1 can be lowered by the single crystal diamond layer 2 containing: any one of tantalum, rhenium, iron, nickel, cobalt, aluminum, gallium, germanium, iridium, and phosphorus, each of which is an element that has a larger atomic radius than carbon and enters between the lattices of a single crystal diamond, like tungsten; molybdenum; and silicon.

Comparative Example 1

The same CVD substrate as in Example 1 was used as the substrate 1. Then, as Comparative Example 1, a single crystal diamond layer (composed of one single crystal diamond layer) was formed on the substrate 1 by a microwave plasma CVD method under the conditions for forming the single crystal diamond layer 3 in Example 1.

The cathodoluminescence of the formed single crystal diamond layer was measured and the dislocation density was estimated to be $2.1\times10^6$ $cm^{-2}$. Here, the apparatus and measurement conditions used for the cathodoluminescence measurement are the same as in Example 1.

When a single crystal diamond layer is grown by a microwave plasma CVD method, source of tungsten, silicon, and molybdenum are not provided, so the single crystal diamond layer grown by the microwave plasma CVD method does not contain tungsten, silicon, and molybdenum (i.e., point defects). As a result, a dislocation density cannot be lowered below that of the substrate. That is, the propagation of a dislocation density cannot be suppressed. The same applies when any one of tantalum, rhenium, iron, nickel, cobalt, aluminum, gallium, germanium, iridium, and phosphorus is used instead of tungsten.

Example 2

A high-temperature and high-pressure substrate (HPHT Ib substrate) having a dislocation density of $1\times10^4$ $cm^{-2}$ was used as the substrate 1. Then, a single crystal diamond layer 2 made of p+-type single crystal diamond was formed on the substrate 1 by a hot filament CVD method under the same conditions as the conditions for forming the single crystal diamond layer 2 in Example 1, and then a single crystal diamond layer 3 made of p-type single crystal diamond was formed on the single crystal diamond layer 2 by a hot filament CVD method under the same conditions for forming the single crystal diamond layer 2, whereby a single crystal diamond (substrate 1/single crystal diamond layer 2/single crystal diamond layer 3) was produced.

In this case, 5 sccm of 2% trimethylboron (TMB: B($CH_3$)$_3$) gas diluted with hydrogen was introduced into the hot filament CVD apparatus as a material gas for forming the p+-type single crystal diamond. The B concentration of the single crystal diamond layer 2 is $1 \times 10^{20}$ cm$^{-3}$. Also, 1 sccm of 2% trimethylboron (TMB: B(CH$_3$)$_3$) gas diluted with hydrogen was introduced into the hot filament CVD apparatus as a material gas for forming the p-type single crystal diamond. The B concentration of the single crystal diamond layer 3 is $2 \times 10^{18}$ cm$^{-3}$.

Then, the cathodoluminescence of each of the single crystal diamond layer 2 and the single crystal diamond layer 3 of a single crystal diamond 10-2 in Example 2 was measured. As a result, the dislocation densities of the single crystal diamond layer 2 and the single crystal diamond layer 3 were 0 cm$^{-2}$.

It was found that the dislocation density of the single crystal diamond can be made 0 cm$^{-2}$ by forming both the single crystal diamond layer 2 and the single crystal diamond layer 3 by a hot filament CVD method, as described above.

Example 3

A single crystal diamond made of substrate 1/single crystal diamond layer 2/single crystal diamond layer 3 was produced in the same way as in Example 1 except that the substrate 1 having a dislocation density of $1.2 \times 10^6$ cm$^{-2}$ was used.

Figure 7:
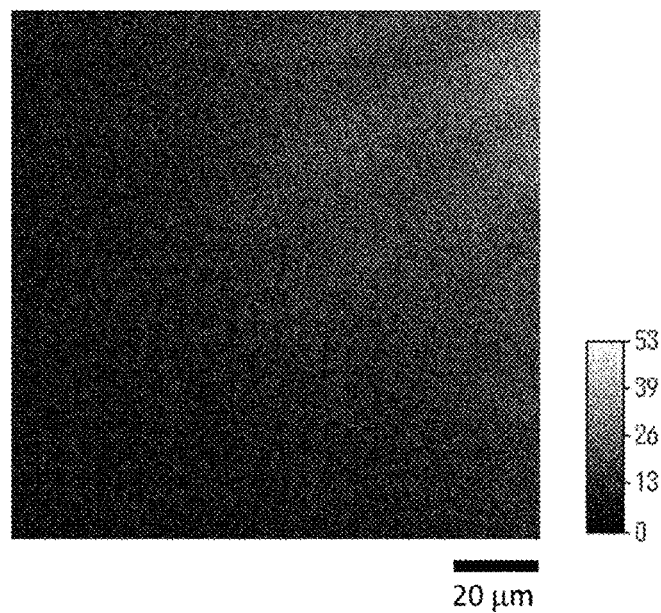
FIG. 7 is a diagram showing a result of measuring the cathodoluminescence of a single crystal diamond in Example 3.

FIG. 7 is a diagram showing a result of the cathodoluminescence of a single crystal diamond 10-3 in Example 3. The measuring apparatus and the measuring conditions used for the cathodoluminescence measurement are as described in Example 1.

With reference to FIG. 7, no light emission is observed from the single crystal diamond 10-3 in Example 3. Therefore, it was found that the dislocation density of the single crystal diamond 10-3 in Example 3 was 0 cm$^{-2}$. The cathodoluminescence was measured for several areas of the single crystal diamond 10-3, but in all the areas no light emission was observed from the single crystal diamond 10-3, and it was confirmed that the dislocation density of the single crystal diamond 10-3 was 0 cm$^{-2}$.

Example 4

A heteroepitaxial diamond was used as the substrate 1. Then, a single crystal diamond layer 2 made of p-type single crystal diamond was formed on the substrate 1 by using the same hot filament CVD apparatus as in Example 1.

In this case, the temperature of the hot filaments, the substrate temperature, and the pressure in the hot filament CVD apparatus were set to be the same as in Example 1. As material gases, methane (CH$_4$) gas, hydrogen (H$_2$) gas, and trimethylboron (TMB: B(CH$_3$)$_3$) gas were used, in which the flow rate of the methane (CH$_4$) gas was 30 sccm and the flow rate of the hydrogen (H$_2$) gas was 1000 sccm. The film thickness of the p-type single crystal diamond was 3 μm.

The cathodoluminescence of a single crystal diamond 10-4 in Example 4 was measured. The apparatus used for the measurement is the same as the apparatus in Example 1. The conditions for measuring the cathodoluminescence is acceleration voltage 15 kV, sample temperature 80 K, and the center wavelength of a bandpass filter of 430 nm.

Figure 8:
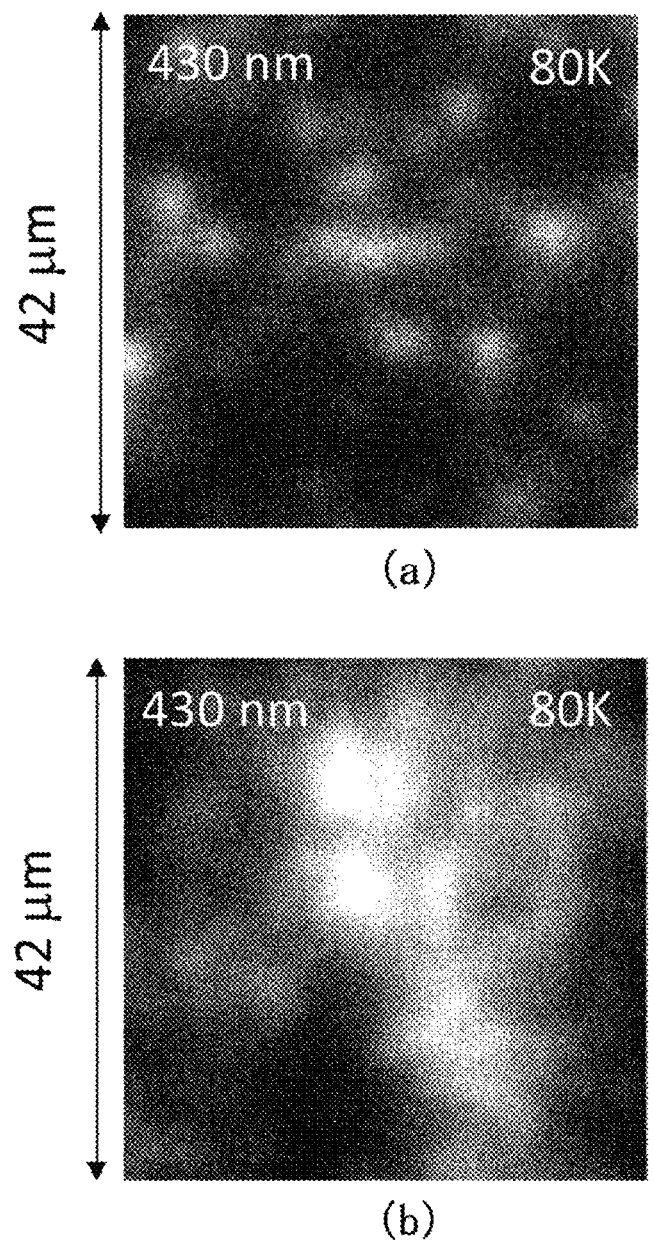
FIG. 8 is diagrams showing results of measuring the cathodoluminescence of a single crystal diamond in Example 4.

FIG. 8 is diagrams showing results of the cathodoluminescence of the single crystal diamond 10-4 in Example 4. FIG. 8(a) shows a result of the cathodoluminescence of the single crystal diamond 10-4 in Example 4, and (b) of FIG. 8 shows a result of the cathodoluminescence of the heteroepitaxial diamond which is used for substrate.

With reference to FIG. 8, the light emission from the single crystal diamond 10-4 in Example 4 is less than the light emission from the heteroepitaxial diamond.

Then, as a result of obtaining dislocation densities from the results of measuring the cathode luminescence, the dislocation density of the single crystal diamond 10-4 in Example 4 was $2 \times 10^6$ cm$^{-2}$, and the dislocation density of the heteroepitaxial diamond was $1 \times 10^8$ cm$^{-2}$.

As described above, it was found that the dislocation density of the single crystal diamond layer 2 can be lower than the dislocation density of the substrate 1 by about two orders of magnitude by forming the single crystal diamond layer 2 having one layer on the substrate 1.

Example 5

The same CVD substrate as in Example 1 was used as the substrate 1. Then, a single crystal diamond layer 2 was formed on the substrate 1 by using hot filaments made of tantalum (Ta) with a purity of 99.9% and under the same conditions as the conditions for forming the single crystal diamond layer 2 in Example 1, whereby substrate 1/single crystal diamond layer 2 was produced.

Figure 9:
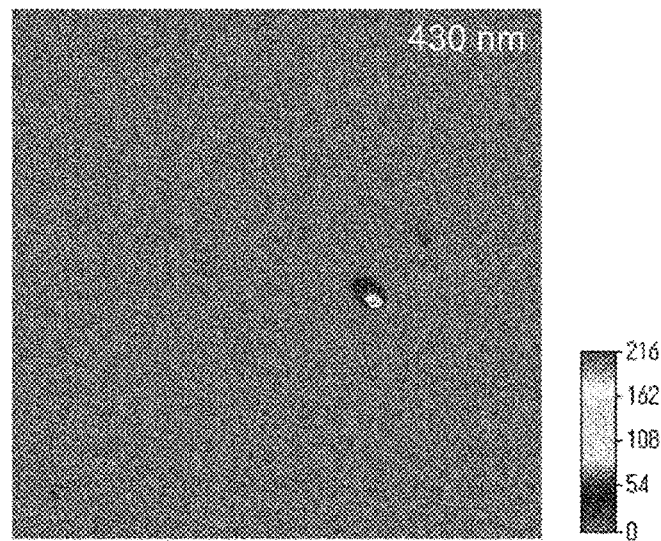
FIG. 9 is diagrams showing results of measuring the cathodoluminescence of a single crystal diamond in Example 5.
Figure 9:
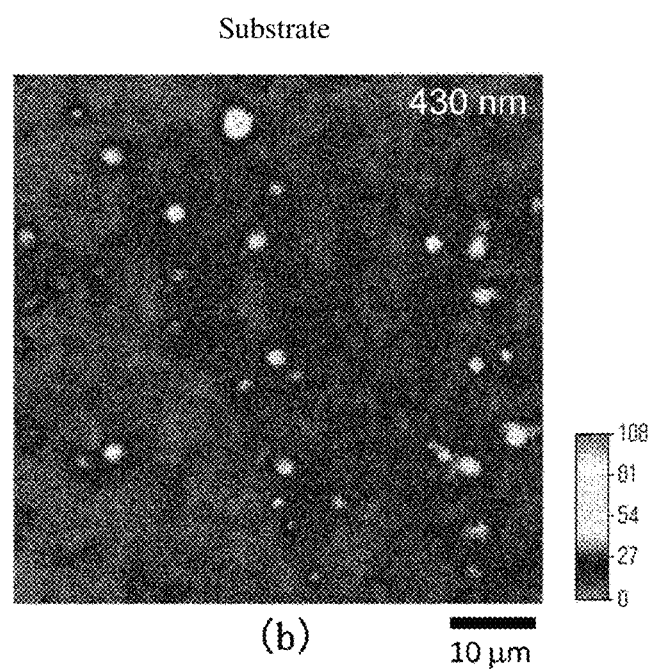

FIG. 9 is diagrams showing results of the cathodoluminescence of the single crystal diamond in Example 5. (a) of FIG. 9 shows a result of the cathode luminescence of a single crystal diamond 10-5 in Example 5, and (b) of FIG. 9 shows a result of the cathodoluminescence of the diamond substrate (substrate 1 made of diamond). Here, the apparatus and measurement conditions used for the cathodoluminescence measurement are the same as in Example 1.

With reference to FIG. 9, almost no light emission is observed from the single crystal diamond 10-5 in Example 5 (see (a) of FIG. 9). On the other hand, much light emission was observed from the diamond substrate.

Then, as a result of obtaining the dislocation densities from the results of measuring the cathodoluminescence, the dislocation density of the single crystal diamond 10-5 in Example 5 was $7.6 \times 10^4$ cm$^{-2}$, and the dislocation density of the diamond substrate was $2.1 \times 10^6$ cm$^{-2}$.

As described above, the dislocation density was able to be lowered from $2.1 \times 10^6$ cm$^{-2}$ to $7.6 \times 10^4$ cm$^{-2}$ by forming the single crystal diamond layer 2 using hot filaments made of Ta. It is considered that this is because dislocations which propagate from the substrate 1 was suppressed by forming the single crystal diamond layer 2 using hot filaments made of Ta, thereby Ta, Si, and Mo entering the single crystal diamond layer 2 to form point defects. Therefore, it was demonstrated that also when hot filaments made of Ta are used, dislocation propagation from the substrate 1 can be suppressed and the dislocation density of the single crystal diamond layer 2 can be lowered.

As shown in Examples 1 to 5, it was found that when the thickness of the single crystal diamond layer 2 is 1 μm or more, the dislocation density can be lowered to the order of $10^4$ cm$^{-2}$, and preferably lowered by two orders of magnitude or more.

Example 6

The same CVD substrate as in Example 1 was used as the substrate 1. Then, a single crystal diamond layer 2 made of p-type single crystal diamond was formed on the substrate 1 under the same conditions as the conditions for forming the single crystal diamond layer 2 in Example 1, and then a single crystal diamond layer 3 was formed on the single crystal diamond layer 2 in the same way as in Example 1, whereby a single crystal diamond (substrate 1/single crystal diamond layer 2/single crystal diamond layer 3) was produced. In this case, 5 sccm of 2% trimethylboron (TMB: $B(CH_3)_3$) gas diluted with hydrogen was introduced into the hot filament CVD apparatus as a material gas for forming the p-type single crystal diamond. The B concentration of the single crystal diamond layer 2 is $1\times10^{20}$ $cm^{-3}$.

Then, the surface of the single crystal diamond layer 3 was terminated with hydrogen by using hydrogen plasma by a microwave plasma CVD method under the conditions of 1000° C., 15960 Pa, and 5 minutes.

Then, Ti/Mo/Au was formed on the single crystal diamond layer 3 as ohmic electrodes by an electron-beam (EB) evaporator apparatus. In this case, Ti has a thickness of 10 nm, Mo has a thickness of 10 nm, and Au has a thickness of 30 nm.

After the ohmic electrodes were formed, the surface of the single crystal diamond layer 3 was treated with oxygen plasma. In this case, the substrate temperature is room temperature, the flow rate of oxygen ($O_2$) gas is 60 sccm, and the pressure is 5 Pa.

After the treatment with oxygen plasma was performed, Mo/Au was formed as Schottky electrodes on the surface of the single crystal diamond layer 3 by a EB evaporator apparatus, whereby a semiconductor element (having the structure shown in FIG. 3) was produced. In this case, Mo has a thickness of 10 nm and Au has a thickness of 30 nm.

Comparative Example 2

The same CVD substrate as in Example 1 was used as the substrate 1. Then, a single crystal diamond layer (composed of one single crystal diamond layer) was formed on the substrate 1 by a microwave plasma CVD method under the same conditions as the conditions for forming the single crystal diamond layer 3 in Example 1.

Thereafter, ohmic electrodes and Schottky electrodes were formed on the single crystal diamond layer in the same way as in Example 6, whereby a semiconductor element (having the structure of substrate/single crystal diamond layer/electrodes) was produced.

The current-voltage characteristics at room temperature of the semiconductor element in Example 6 and the semiconductor element in Comparative Example 2 were measured.

Figure 10:
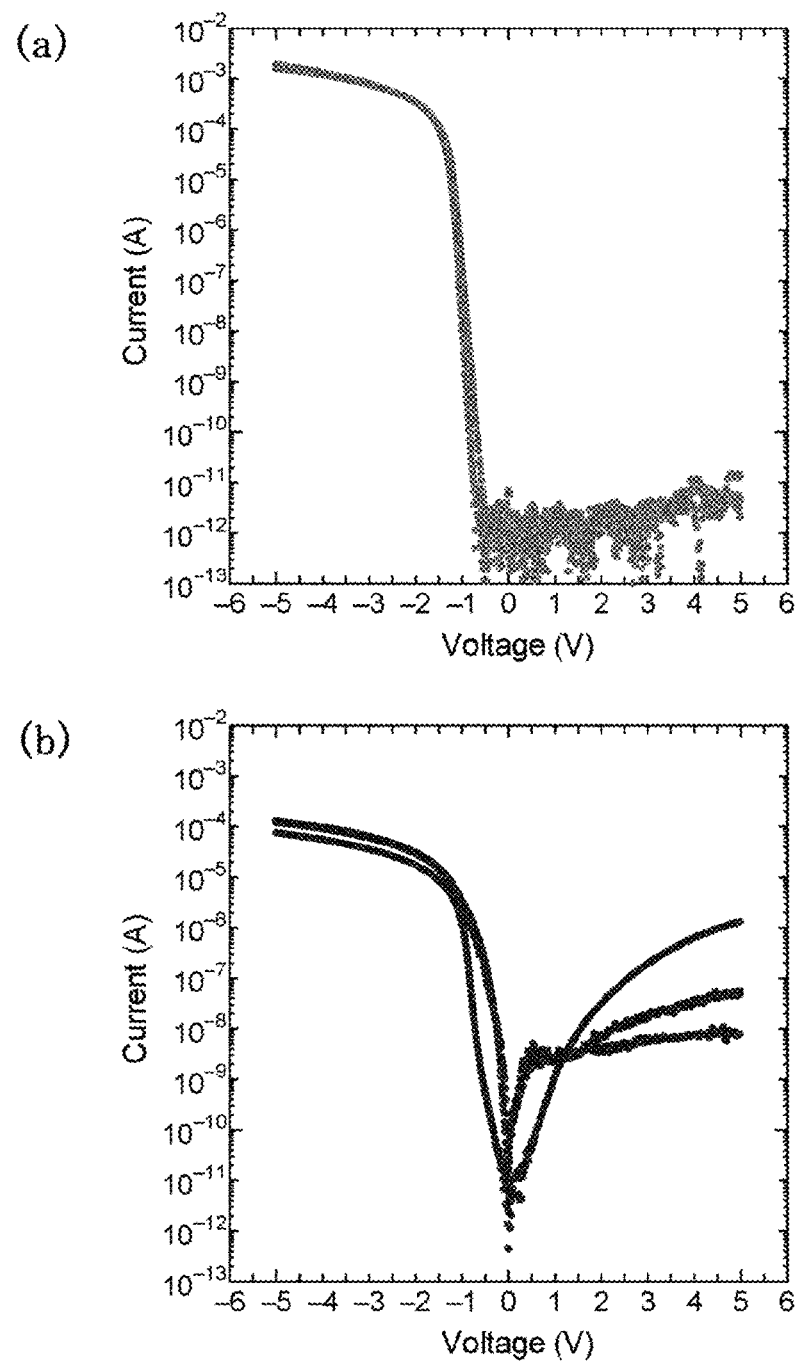
FIG. 10 is graphs showing current-voltage characteristics at room temperature of semiconductor elements in Example 6 and Comparative Example 2.

FIG. 10 is graphs showing the current-voltage characteristics at room temperature of the semiconductor elements in Example 6 and Comparative Example 2. In FIG. 10, the vertical axis represents a current and the horizontal axis represents a voltage. FIG. 10(a) shows the current-voltage characteristics of the semiconductor element in Example 6, and FIG. 10(b) shows the current-voltage characteristics of the semiconductor element in Comparative Example 2.

With reference to FIG. 10, the semiconductor element in Example 6 exhibits very good rectification characteristics, and the reverse current is lower than $1\times10^{-11}$ A (see (a) of FIG. 10).

On the other hand, the semiconductor element in Comparative Example 2 has poor rectification characteristics (see (b) of FIG. 10). In the semiconductor element in Comparative Example 2, the reverse current is $1\times10^{-8}$ A to $1\times10^{-6}$ A, which is higher than the reverse current of the semiconductor element in Example 6 by 3 to 5 orders of magnitude.

Figure 11:
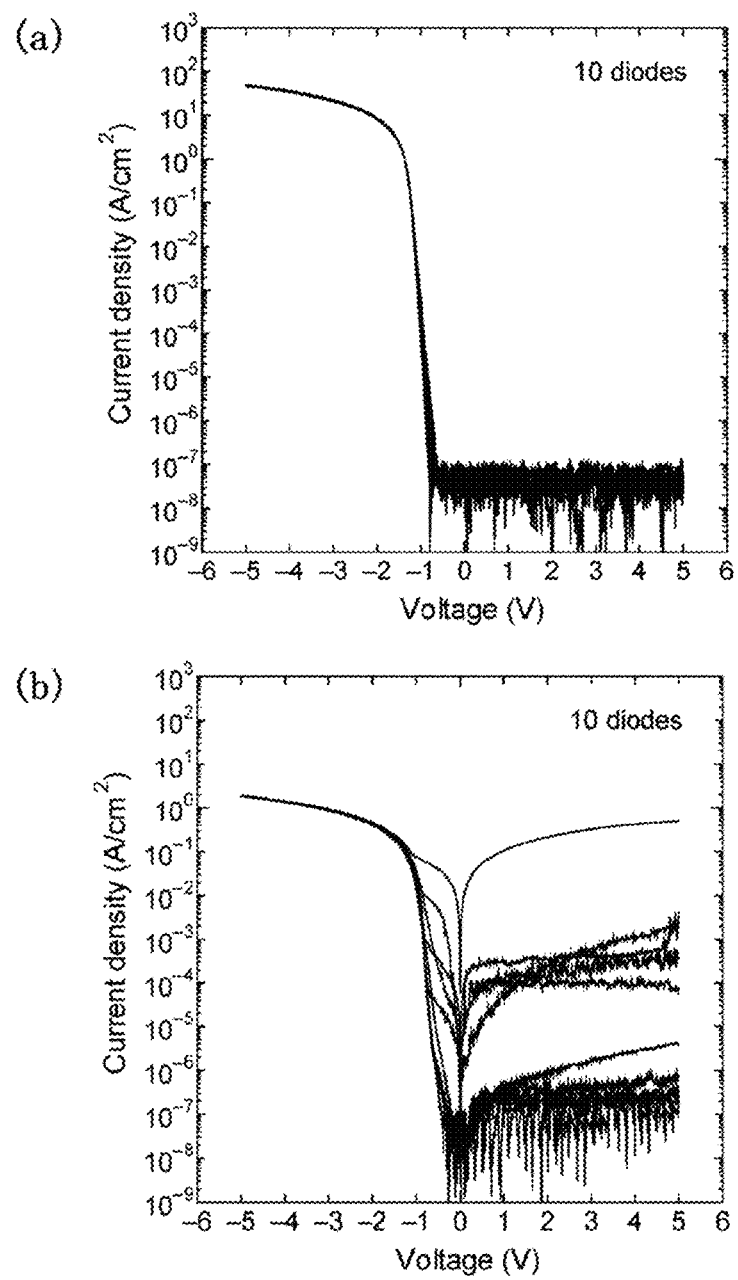
FIG. 11 is graphs showing other current-voltage characteristics of semiconductor elements in Example 6 and Comparative Example 2.

FIG. 11 is graphs showing other current-voltage characteristics of the semiconductor elements in Example 6 and Comparative Example 2. In FIG. 11, the vertical axis represents a current density and the horizontal axis represents a voltage. FIG. 11(a) shows the current-voltage characteristics of ten semiconductor elements in Example 6, and FIG. 11(b) shows the current-voltage characteristics of ten semiconductor elements in Comparative Example 2.

With reference to FIG. 11, the semiconductor element in Example 6 exhibits very good rectification characteristics, and the reverse current is about $1\times10^{-7}$ (A/$cm^2$). Further, the semiconductor element in Example 6 exhibits current-voltage characteristics with good uniformity (see (a) of FIG. 11).

On the other hand, the semiconductor element in Comparative Example 2 has poor rectification characteristics, and the reverse current is in the order of $10^{-7}$ (A/$cm^2$) to $10^{-1}$ (A/$cm^2$). Therefore, in the semiconductor element in Comparative Example 2, a variation in the current-voltage characteristics is very large (see (b) of FIG. 11).

Figure 12:
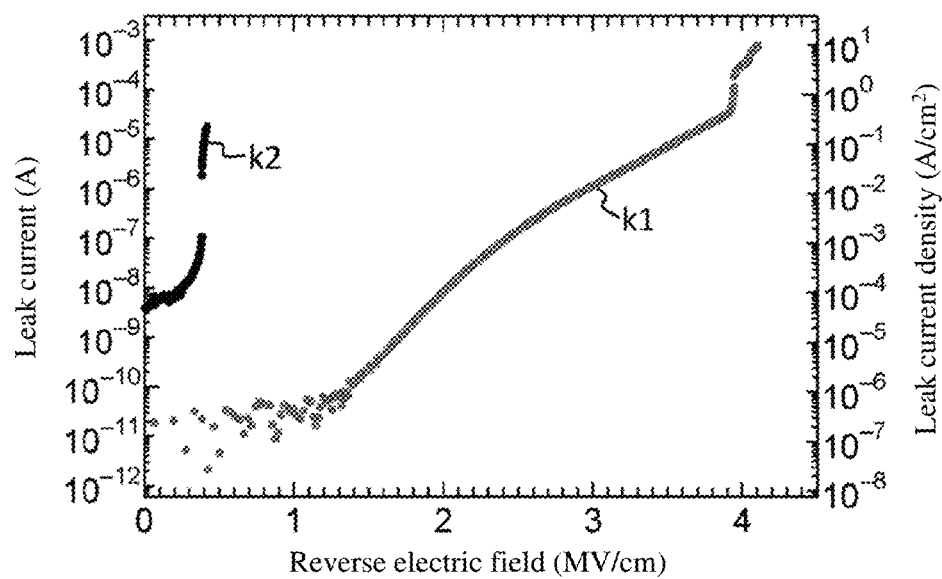
FIG. 12 is a graph showing the relationship between a leakage current and an electric field strength at room temperature of a semiconductor element.

FIG. 12 is a graph showing the relationship between a leakage current and an electric field strength at room temperature of a semiconductor element. In FIG. 12, the vertical axis represents the leak current and the horizontal axis represents the electric field strength. A curve k1 shows the relationship between a leakage current and an electric field strength of the semiconductor element in Example 6, and a curve k2 shows the relationship between a leakage current and an electric field strength of the semiconductor element in Comparative Example 2.

With reference to FIG. 12, the leakage current of the semiconductor element in Example 6 is lower than $1\times10^{-10}$ [A] until the electric field strength becomes 1.4 [MV/cm], and increases as the electric field strength becomes higher than 2 [MV/cm]. The semiconductor element in Example 6 showed breakdown behavior at an electric field strength of about 4.0 [MV/cm] (see the curve k1).

On the other hand, the leakage current of the semiconductor element in Comparative Example 2 is $1\times10^{-8}$ [A] or lower at the electric field strength below 0.3 [MV/cm]. The semiconductor element in Comparative Example 2 then showed breakdown behavior at an electric field strength of 0.4 [MV/cm] (see the curve k2).

Therefore, the semiconductor element in Example 6 has a lower leakage current and a 10 times or higher breakdown electric field strength than the semiconductor element in Comparative Example 2. It is considered that the reason why a large breakdown electric field strength is obtained as described above is because the dislocation densities of the single crystal diamond layers 2, 3 are lowered.

The current-voltage characteristics of a semiconductor element having a Schottky contact are expressed by the following equation.

$$I=I_0[\exp(qV/nkT)-1] \quad (1)$$

In the equation (1), I is a current, V is a voltage, $I_0$ is a reverse saturation current, q is an elementary charge, k is the Boltzmann constant, and n is an ideality factor. It shows that the closer n to "1.0" that is an ideal value, the better the current-voltage characteristics are.

The n values were obtained for the semiconductor elements in Example 6 and Comparative Example 2 by fitting the measured current-voltage characteristics into the equation (1). As a result, the n value of the semiconductor element in Example 6 was 1.1, and the n value of the semiconductor element in Comparative Example 2 was 2.7.

Additionally, the barrier heights of the Schottky contacts were obtained for the semiconductor elements in Example 6 and Comparative Example 2. As a result, the barrier height for the semiconductor element in Example 6 was 1.38 eV, and the barrier height for the semiconductor element in Comparative Example 2 was 0.95 eV.

It was found that the semiconductor element in Example 6 had an n value closer to the ideal value and a larger barrier height than the semiconductor element in Comparative Example 2, as described above. It is considered that this is because the dislocation densities of the single crystal diamond layers 2, 3 are lowered as described above.

Example 7

A high-temperature and high-pressure substrate (HPHT Ib substrate) having a dislocation density of $1 \times 10^4$ cm$^{-2}$ was used as the substrate 1. Then, the substrate 1/single crystal diamond layer 2/single crystal diamond layer 3 in Example 2 was produced, and then Ti/Mo/Au was formed on the surface of the single crystal diamond layer 3 as ohmic electrodes and Mo/Au was formed on the surface of the single crystal diamond layer 3 as Schottky electrodes in the same way as in Example 6, whereby a semiconductor element (having the structure shown in FIG. 3) was produced. In this case, the thickness of each of Ti, Mo, and Au in the ohmic electrode and the thickness of each of Mo and Au in the Schottky electrode are as described above.

Figure 13:
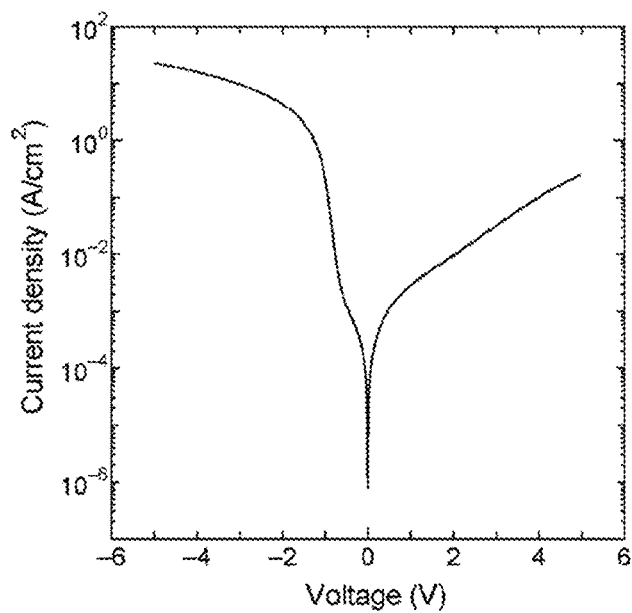
FIG. 13 is a graph showing current-voltage characteristics at room temperature of a semiconductor element in Example 7.

FIG. 13 is a graph showing the current-voltage characteristics at room temperature of the semiconductor element in Example 7. In FIG. 13, the vertical axis represents a current density and the horizontal axis represents a voltage. With reference to FIG. 13, it was found that the semiconductor element (Schottky element) using the single crystal diamond layer 3 made of p-type single crystal diamond as a drift layer exhibits rectification characteristics. It was demonstrated that the semiconductor element (Schottky element) exhibits rectification characteristics despite the single crystal diamond layer 3 containing B at a concentration of $2.0 \times 10^{18}$ cm$^{-3}$, as shown in Example 2. In a conventional semiconductor element (Schottky element), rectification characteristics cannot be obtained if a drift layer contains B at a concentration of the order of $10^{18}$ cm$^{-3}$.

Example 8

The same CVD substrate as in Example 1 was used as the substrate 1. Then, a single crystal diamond layer 2 made of p-type single crystal diamond was formed on the substrate 1 by a hot filament CVD method under the same conditions for forming the single crystal diamond layer 2 in Example 1, and then the substrate 1/single crystal diamond layer 2 was taken out of the hot filament CVD apparatus, so that the substrate 1/single crystal diamond layer 2 was placed on a sample stage in a 5 kW microwave plasma CVD apparatus made by SEKI DIAMOND SYSTEMS.

Then, the inside of the microwave plasma CVD chamber was evacuated down to the $5 \times 10^{-5}$ Pa.

Subsequently, 20 sccm of methane (CH$_4$) gas and 480 sccm of hydrogen (H$_2$) gas were introduced into the microwave plasma CVD apparatus, the pressure in the microwave plasma CVD apparatus was set to 15960 Pa, and the temperature of the substrate was set to 900° C.

Then, a single crystal diamond layer 3 made of p-type single crystal diamond was formed on the single crystal diamond layer 2 for one hour by applying a high-frequency power of 2500 W and by a microwave plasma CVD method.

Thereafter, Ti/Mo/Au was formed on the surface of the single crystal diamond layer 3 as ohmic electrodes and Mo/Au was formed on the surface of the single crystal diamond layer 3 as Schottky electrodes in the same way as in Example 6, whereby a semiconductor element (having the structure shown in FIG. 3) was produced. In this case, the thickness of each of Ti, Mo, and Au in the ohmic electrode and the thickness of each of Mo and Au in the Schottky electrode are as described above.

The single crystal diamond layer 2 made of p-type single crystal diamond has a thickness of 1.4 µm and a B concentration of $2.5 \times 10^{18}$ cm$^{-3}$. The single crystal diamond layer 3 made of p-type single crystal diamond has a thickness of 5 µm and a B concentration of $2 \times 10^{15}$ cm$^{-3}$.

Comparative Example 3

The same CVD substrate as in Example 1 was used as the substrate 1. Then, a single crystal diamond layer 3 made of p-type single crystal diamond was formed on the substrate 1 under the same conditions as the conditions for forming the single crystal diamond layer 3 in Example 8. The single crystal diamond layer 3 has a thickness of 5 µm and has a B concentration of $2 \times 10^{15}$ cm$^{-3}$.

Then, Ti/Mo/Au was formed on the surface of the single crystal diamond layer 3 as ohmic electrodes and Mo/Au was formed on the surface of the single crystal diamond layer 3 as Schottky electrodes in the same way as in Example 6, whereby a semiconductor element was produced. The thicknesses of each of Ti, Mo, and Au in the ohmic electrode and the thicknesses of each of Mo and Au in the Schottky electrode are the same as in Example 8.

Figure 14:
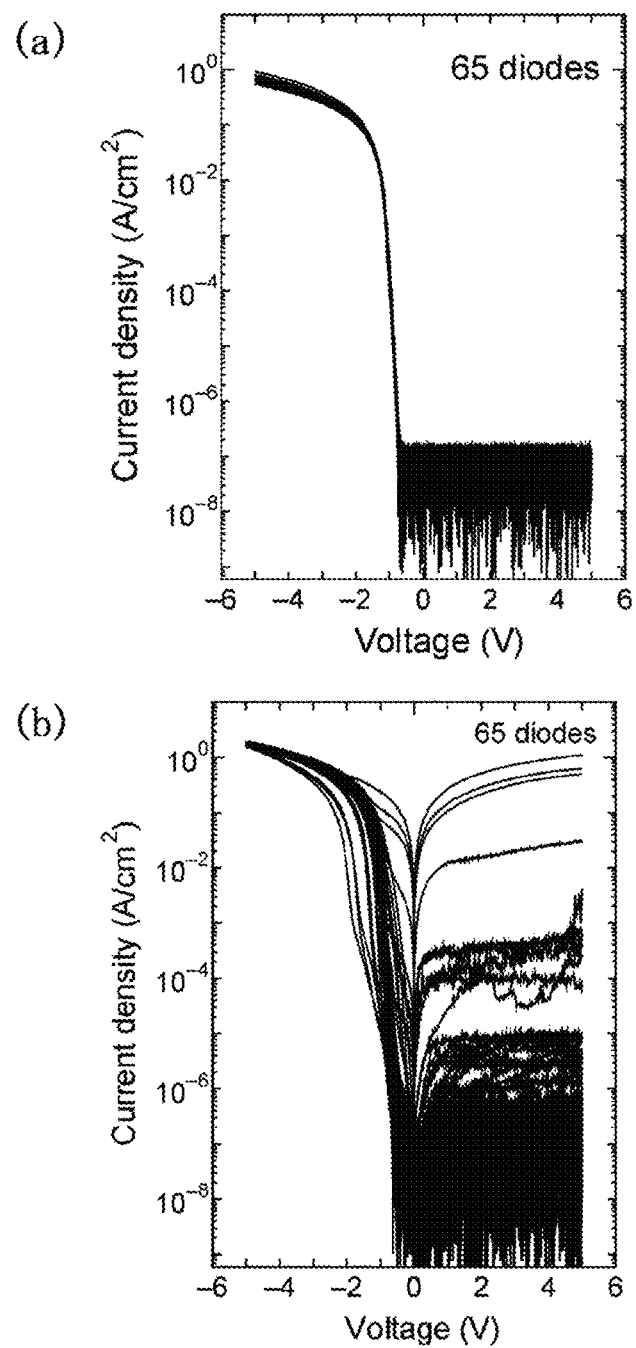
FIG. 14 is graphs showing current-voltage characteristics at room temperature of semiconductor elements in Example 8 and Comparative Example 3.

FIG. 14 is graphs showing the current-voltage characteristics at room temperature of the semiconductor elements in Example 8 and Comparative Example 3. In FIG. 14, the vertical axis represents a current density and the horizontal axis represents a voltage. FIG. 14(a) shows the current-voltage characteristics of the semiconductor element in Example 8, and FIG. 14(b) shows the current-voltage characteristics of the semiconductor element in Comparative Example 3.

With reference to FIG. 14, the semiconductor element in Example 8 exhibits very good rectification characteristics, and the reverse current is lower than $2 \times 10^{-7}$ A (see (a) of FIG. 14). FIG. 14(a) shows the current-voltage characteristics of 65 semiconductor elements, in which the 65 semiconductor elements in Example 8 exhibit current-voltage characteristics with very good uniformity.

On the other hand, among the semiconductor elements in Comparative Example 3, 23 semiconductor elements exhibit almost the same rectification characteristics as those of the semiconductor elements in Example 8, and 42 semiconductor elements exhibit the reverse saturation current of the order of $10^{-7}$ to $10^0$ (A/cm$^2$) (see (b) of FIG. 14). As described above, the semiconductor element in Comparative Example 3 exhibits current-voltage characteristics with very poor uniformity.

As described above, the semiconductor element in Example 8 exhibits rectification characteristics with very good uniformity, and it is considered that this is because the dislocation density of the single crystal diamond layer 3 is low.

Here, in the current-voltage characteristics of the semiconductor elements in Example 8 and Comparative Example 3 shown in FIG. 14, the forward saturation current densities are at the same level as about $10^0$ (A/cm$^2$), and hence the current-voltage characteristics shown in FIG. 14 show the current-voltage characteristics when a current flows through the single crystal diamond layer 3 in the direction parallel to the substrate 1.

Figure 15:
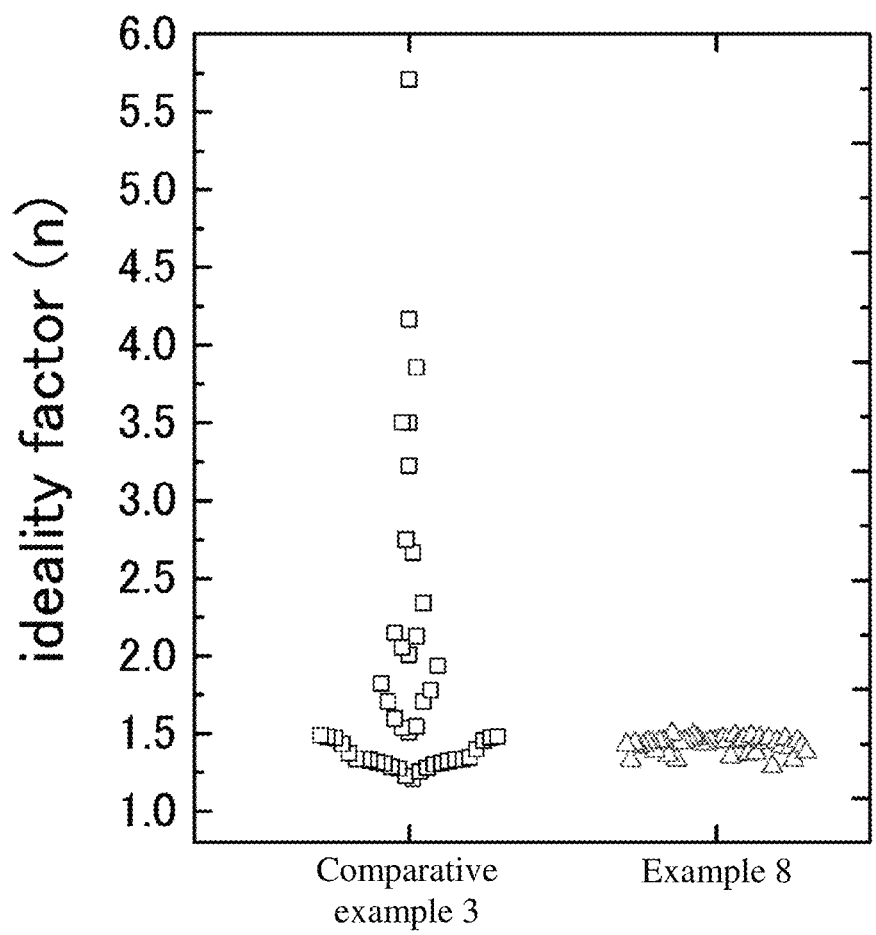
FIG. 15 is a diagram showing ideality factors (n values) of the semiconductor elements in Example 8 and Comparative Example 3.

FIG. 15 is a diagram showing the ideality factors (n values) of the semiconductor elements in Example 8 and Comparative Example 3. With reference to FIG. 15, the semiconductor element in Example 8 has an n value in the range of 1.29 to 1.50, and the semiconductor element in Comparative Example 3 has an n value in the range of 1.21 to 5.71.

As described above, the n values of the semiconductor elements in Example 8 show a distribution with good uniformity, and the n values of the semiconductor elements in Comparative Example 3 show a distribution with large variation.

Figure 16:
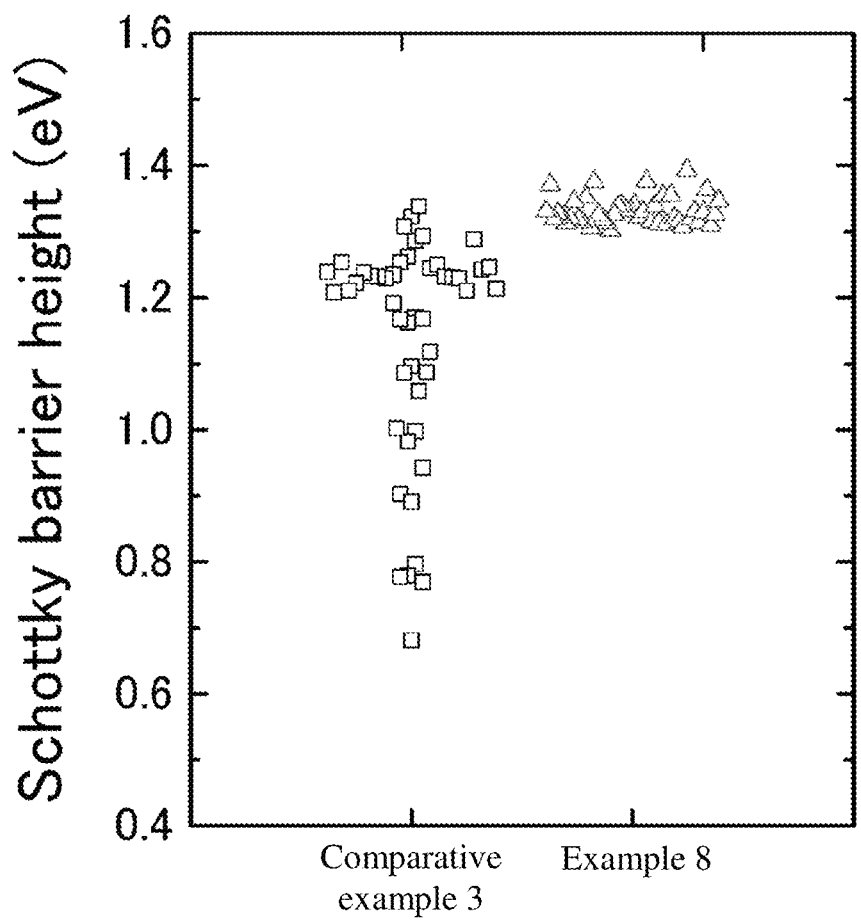
FIG. 16 is a diagram showing barrier heights of the semiconductor elements in Example 8 and Comparative Example 3.

FIG. 16 is a diagram showing barrier heights of the semiconductor elements in Example 8 and Comparative Example 3. With reference to FIG. 16, the semiconductor element in Example 8 has a barrier height in the range of 1.30 to 1.39, and the semiconductor element in Comparative Example 3 has a barrier height of 0.68 to 1.34.

As described above, the barrier heights of the semiconductor elements in Example 8 also exhibit a distribution with good uniformity, and the barrier heights of the semiconductor elements in Comparative Example 3 also exhibit a distribution with large variation.

In the semiconductor element (Schottky element) in which a current flows through the single crystal diamond layer 3 in the direction parallel to the substrate 1, it was found that the uniformity of current-voltage characteristics is dramatically improved by adopting the configuration of single crystal diamond layer 2/single crystal diamond layer 3, as described above. This is because the semiconductor element in Example 8 has an n value and a barrier height with good uniformity.

INDUSTRIAL APPLICABILITY

The present invention can be applied to single crystal diamonds and semiconductor elements using the same.

DESCRIPTION OF REFERENCE SIGNS

1: Substrate
2, 3: Single crystal diamond layer
4, 5: Electrode
10: Single crystal diamond
100, 100A: Semiconductor element.

The invention claimed is:

1. A single crystal diamond comprising a first single crystal diamond layer formed on a substrate and containing a point defect, wherein the first single crystal diamond layer has a lower dislocation density than the substrate and wherein the first single crystal diamond layer comprises any one of tungsten, tantalum, rhenium, iron, nickel, cobalt, aluminum, gallium, germanium, iridium, phosphorus, silicon, and molybdenum.

2. The single crystal diamond according to claim 1, further comprising a second single crystal diamond layer grown on the first single crystal diamond layer and having a lower dislocation density than the substrate.

3. The single crystal diamond according to claim 2, wherein the second single crystal diamond layer has a lower dislocation density than the substrate by two orders of magnitude or more.

4. The single crystal diamond according to claim 1, wherein the first single crystal diamond layer has a film thickness of 1 µm or more.

5. The single crystal diamond according to claim 2, wherein the second single crystal diamond layer has a film thickness of 200 µm or more.

6. The single crystal diamond according to claim 2, wherein the first single crystal diamond layer further contains a p-type dopant.

7. A semiconductor element comprising:
the single crystal diamond according to claim 6;
a first metal that forms a Schottky contact with the second single crystal diamond layer; and
a second metal that forms an ohmic contact with the first single crystal diamond layer or the second single crystal diamond layer.

\* \* \* \* \*